(12) United States Patent
Davis et al.

(10) Patent No.: US 10,278,312 B1
(45) Date of Patent: Apr. 30, 2019

(54) THERMAL MANAGEMENT FOR EXTEND OLED AND MICRO LED AVIONICS LIFE

(71) Applicant: Rockwell Collins, Inc., Cedar Rapids, IA (US)

(72) Inventors: Joshua V. Davis, Cedar Rapids, IA (US); Steven W. Kramer, Toddville, IA (US)

(73) Assignee: ROCKWELL COLLINS, INC., Cedar Rapids, IA (US)

(*) Notice: Subject to any disclaimer, the term of this patent is extended or adjusted under 35 U.S.C. 154(b) by 0 days.

(21) Appl. No.: 15/722,735

(22) Filed: Oct. 2, 2017

(51) Int. Cl.
| | |
|---|---|
| H05K 7/20 | (2006.01) |
| H05K 5/00 | (2006.01) |
| H05K 5/02 | (2006.01) |
| H01L 33/64 | (2010.01) |
| H01L 51/52 | (2006.01) |
| G09G 3/3208 | (2016.01) |

(52) U.S. Cl.
CPC ....... H05K 7/20972 (2013.01); H05K 5/0017 (2013.01); H05K 5/0213 (2013.01); G09G 3/3208 (2013.01); G09G 2300/0452 (2013.01); G09G 2320/041 (2013.01); H01L 33/644 (2013.01); H01L 33/648 (2013.01); H01L 51/529 (2013.01); H01L 51/5237 (2013.01)

(58) Field of Classification Search
CPC ............ H05K 7/20972; H05K 5/0017; H05K 5/0213; G09G 3/3208; G09G 2300/0452; G09G 2320/041; H01L 33/644; H01L 33/64–33/648; H01L 51/5237; H01L 51/529; F21V 29/50–29/83; F21V 29/02; F21V 29/15; H05B 33/0893; H05B 33/04–33/06

USPC .......... 362/612, 631–633, 126, 295; 361/717
See application file for complete search history.

(56) References Cited

U.S. PATENT DOCUMENTS

| | | | |
|---|---|---|---|
| 2005/0122018 A1* | 6/2005 | Morris ...................... | F21K 9/00 313/46 |
| 2006/0132699 A1* | 6/2006 | Cho ....................... | F04D 29/582 349/161 |
| 2009/0091929 A1* | 4/2009 | Faubion ................... | F21V 21/30 362/234 |
| 2010/0204841 A1* | 8/2010 | Chemel .............. | H05B 33/0863 700/282 |
| 2011/0026251 A1* | 2/2011 | Liu ........................ | F21V 29/004 362/249.02 |
| 2011/0210657 A1* | 9/2011 | Paik ..................... | F21V 19/0055 313/46 |
| 2012/0069545 A1* | 3/2012 | Choi ......................... | F21V 3/00 362/84 |

(Continued)

Primary Examiner — Dion Ferguson
Assistant Examiner — Amir A Jalali
(74) Attorney, Agent, or Firm — Donna P. Suchy; Daniel M. Barbieri (57) ABSTRACT

An LED display package includes an LED display assembly, processing and graphics electronics, an LED heatsink, and a thermal isolation component. The LED display assembly includes a plurality of LEDs. The processing and graphics electronics are configured to drive the LED display assembly. The LED heatsink thermally contacts the LED display assembly, and is disposed between the LED display assembly and the processing and graphics electronics. The thermal isolation component is between the LED heatsink and the processing and graphics electronics and is arranged to thermally isolate the processing and graphics electronics from the LED heatsink.

16 Claims, 11 Drawing Sheets

(56) References Cited

U.S. PATENT DOCUMENTS

| | | | |
|---|---|---|---|
| 2012/0169968 A1* | 7/2012 | Ishimori | G02B 6/0023 349/62 |
| 2012/0293719 A1* | 11/2012 | Negoro | G02B 6/0068 348/725 |
| 2013/0215613 A1* | 8/2013 | Wu | F21V 29/70 362/249.02 |
| 2016/0246105 A1* | 8/2016 | Li | G02B 6/0085 |
| 2016/0329478 A1* | 11/2016 | Jin | H01L 35/32 |
| 2016/0363724 A1* | 12/2016 | Jung | G02B 6/0091 |
| 2016/0375833 A1* | 12/2016 | Larson | B60R 1/12 348/148 |
| 2017/0211802 A1* | 7/2017 | Dellock | F21V 29/74 |
| 2017/0277219 A1* | 9/2017 | Chung | H04N 5/2257 |

\* cited by examiner

THERMAL MANAGEMENT FOR EXTEND OLED AND MICRO LED AVIONICS LIFE

The inventive concepts disclosed herein generally relate to the field of organic light emitting diodes (OLEDs) and micro light emitting diodes (LEDs), and display packages employing OLEDs and micro LEDs.

BACKGROUND

Liquid crystal diode (LCD) display packages typically include a display assembly, a backlight which provides light to the display assembly, and processing and graphics electronics which are configured to drive the TFTs. The backlight and processing and graphics electronics, and to a lesser extent the display assembly, generate heat. In order to reduce the operating temperature of the LCD display package, the package often further includes a heat sink disposed between, and thermally in contact with, the backlight and the processing and graphics electronics.

OLED display packages have an advantage over other display packages, such as LCD display packages, which require a backlight. Color OLED display packages generally comprise a display assembly including control circuitry and an array of pixels, where each pixel has a plurality of subpixels, and each subpixel for a particular pixel is of a different color, and has an OLED. The display assembly control circuitry manages the voltage to be applied to each subpixel where the luminance of a subpixel increases with the voltage applied. The processing and graphics electronics, which is separate from the display assembly, provides power and content to be applied to the display assembly.

The luminance of the OLED subpixels degrades with time. OLEDs often suffer from a reduced useful lifetime especially when operated for extended periods of time at maximum luminance. Luminance degradation is further accelerated at elevated temperatures. The luminance degradation is exacerbated in environments where the OLED display package is desired to be operated at near maximum luminance.

SUMMARY

In one aspect, embodiments of the inventive concepts disclosed herein are directed to an LED display package. The LED display package includes an LED display assembly, processing and graphics electronics, an LED heatsink, and a thermal isolation component. The LED display assembly includes a plurality of LEDs. The processing and graphics electronics are configured to drive the LED display assembly. The LED heatsink thermally contacts the LED display assembly, and is disposed between the LED display assembly and the processing and graphics electronics. The thermal isolation component is between the LED heatsink and the processing and graphics electronics arranged to thermally isolate the processing and graphics electronics from the LED heatsink.

In a further aspect, embodiments of the inventive concepts disclosed herein are directed to an LED display package. The LED display package includes an LED display assembly, processing and graphics electronics, an LED heatsink, a thermal insulating material and a processing and graphics electronics heat sink. The LED display assembly includes a plurality of LEDs. The processing and graphics electronics are configured to drive the LED display assembly. The LED heatsink thermally contacts the LED display assembly, and is disposed between the LED display assembly and the processing and graphics electronics. The thermal insulating material is between the LED heatsink and the processing and graphics electronics and is arranged to thermally isolate the processing and graphics electronics from the LED heatsink. The processing and graphics electronics heat sink is separate from the LED heatsink, and thermally contacts the processing and graphics electronics.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Before describing in detail the inventive concepts disclosed herein, it should be observed that the inventive concepts disclosed herein include, but are not limited to, a novel structural combination of an LED display assembly, LED heat sink, processing and graphics electronics, and a thermal isolation component, and not in the particular detailed configurations thereof. Accordingly, the structure, methods, functions, control and arrangement of components, modules, and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language of the claims.

Embodiments of the inventive concepts disclosed herein regarding an LED display package with a thermal isolation component between the LED heatsink and the processing and graphics electronics provide advantages. In this arrangement the LED heatsink is dedicated to dissipating heat from the LED display assembly, but is thermally isolated from the processing and graphics electronics, which generates much more heat than the LED display assembly, by the thermal isolation component. With this arrangement the thermal isolation component, by thermally isolating the processing and graphics electronics from the LED display assembly, may effectively decrease the operation temperature of the LED display assembly, and thus reduce the rate of degradation of the LEDs in the LED display assembly in the case the LEDs are OLEDS. In the case the LEDS are micro LEDs, the micro LEDs benefit from the thermal isolation with respect to both efficiency and performance.

Figure 1:
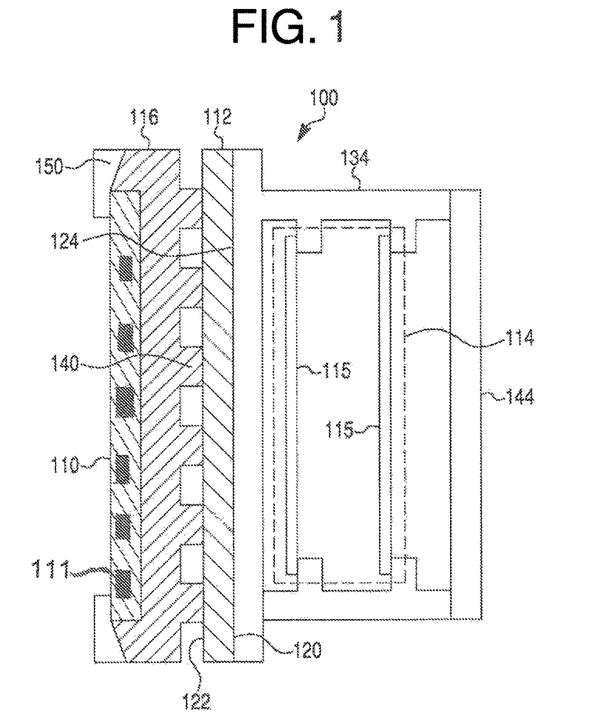
FIG. 1 is a schematic of an LED display package of an embodiment according to inventive concepts disclosed herein.

FIG. 1 is a schematic illustrating an LED display package 100 according to embodiments of the inventive concepts disclosed herein. The LED display package 100 includes an LED display assembly 110, a thermal isolation component 112, processing and graphics electronics 114, and an LED assembly heat sink 116. The LED display assembly 110 may include a plurality of LEDs 111.

The LED display assembly 110 may include an array of pixels, where each pixel includes subpixels. Each subpixel may include an OLED or micro LED providing light when a voltage is applied to the LED, where the luminance of the LED increases with increased voltage applied. The LED display assembly 110 may also include control circuitry. The display assembly control circuitry manages the voltage to be applied to each subpixel where the luminance of a subpixel increases with the voltage applied.

Each subpixel may include an LED of a distinct compound and configuration so that the subpixel generates an appropriate color. For example, for a RGB color format, the pixel may include three subpixels where the color of the light generated by the subpixels is red, green and blue, respectively. As another example, for a RGBY color format, the pixel may include four subpixels where the color of the light generated by the subpixels is red, green, blue and yellow, respectively. As yet another example, for a CMYB color format, the pixel may include four subpixels where the color of the light generated by the subpixels is cyan, magenta, yellow and black, respectively.

The processing and graphics electronics 114 may be implemented, for example, as a circuit board 115. FIG. 1 illustrates the processing and graphics electronics 114 to include two circuit boards 115. In general, the processing and graphics electronics 114 may include one or more circuit boards 115. The processing and graphics electronics 114 are configured to provide power and content to be applied to the LED display assembly 110. The processing and graphics electronics 114 may include one or more processors and one or more memories to implement control. The processing and graphics electronics 114 in operation may generate heat, which may be greater than the heat generated by the LED display assembly 110.

The LED heat sink 116 is disposed between the processing and graphics electronics 114 and the LED display assembly 110. The LED heat sink 116 thermally contacts the LED display assembly 110 and thus draws away heat generated by the LED display assembly 110. The LED heat sink 116 thermally contacts the LED display assembly 110 and may directly or indirectly physically contact the LED display assembly 110. In the case that LED heat sink 116 indirectly physically contacts the LED display assembly 110, a good thermal conducting component is arranged between the LED heat sink 116 and the LED display assembly 110 and the good thermal conducting component directly physically contacts the LED heat sink 116 and the LED display assembly 110. The good thermal conducting component may have one or more subcomponents. The LED heat sink 116 is preferably a good thermal conductor. In this regard, the LED heat sink 116 may comprise a metal, such as aluminum, copper, or alternative natural or engineered materials, for example.

The thermal isolation component 112 is arranged between the LED heat sink 116 and the processing and graphics electronics 114 to thermally isolate the processing and graphics electronics 114 from the LED heat sink 116. Thus, the thermal isolation component 112 does not allow a good thermal conduction path between the LED heat sink 116 and the processing and graphics electronics 114.

The thermal isolation component 112 may achieve thermal isolation of the processing and graphics electronics 114 from the LED heat sink 116 through geometry or through the material's thermal conductive property of the thermal isolation component 112. The thermal isolation component 112 may also achieve thermal isolation of the processing and graphics electronics 114 from the LED heat sink 116 through a combination of geometry and the material of the thermal isolation component 112.

With respect to thermal isolation achieved through the material of the thermal isolation component 112, the thermal isolation component 112 may be a poor thermal conductor. For example the thermal isolation component 112 may be a thermally insulating solid material, such as a glass, or a polymer. Alternatively, the thermal isolation component 112 may be a gas, such as air, or may be a vacuum. The thermal insulating solid material provides a high thermal impedance between the thermal isolation component 112 and the LED heat sink 116.

Figure 2:
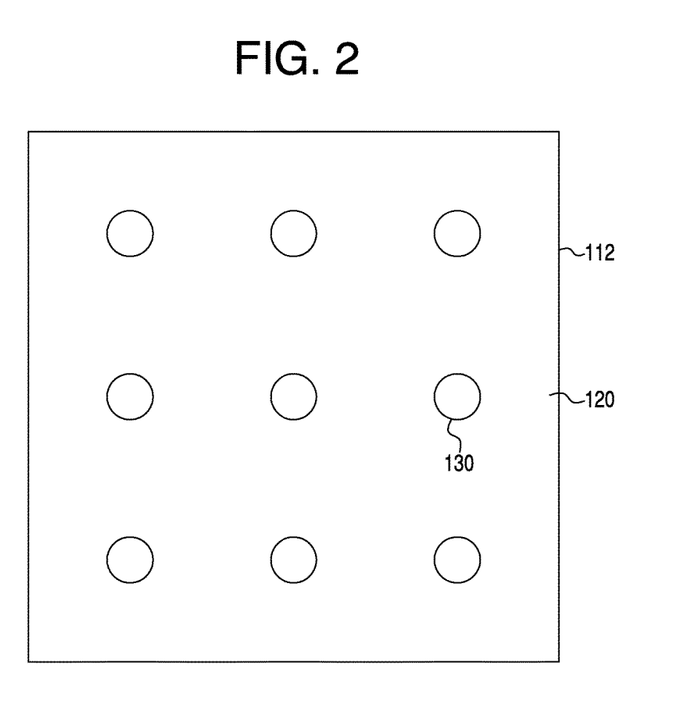
FIG. 2 is a top view schematic illustrating the first surface of the thermal isolation component of the LED display package of FIG. 1 of an embodiment according to inventive concepts disclosed herein.
Figure 3:
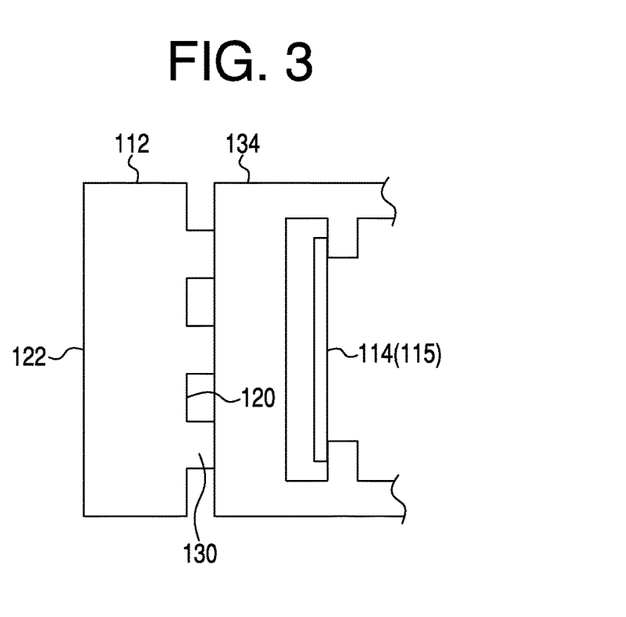
FIG. 3 is a side view schematic illustrating the first surface and second surface of the thermal isolation component relative to the processing and graphics electronics of the LED display package of FIG. 1 of an embodiment according to inventive concepts disclosed herein.

With respect to thermal isolation achieved through geometry, there may be a small contact area between the thermal isolation component 112 and the thermal conductive path to the processing and graphics electronics 114. For example, FIGS. 1-3 illustrate the thermal isolation component 112 having a first surface 120 facing the processing and graphics electronics 114 and a second surface 122 opposing the first surface 120 and facing the LED heat sink 116. FIG. 2 is a top view schematic illustrating the first surface 120 of the thermal isolation component 112. FIG. 3 is a side view schematic illustrating the first surface 120 and second surface 122 of the thermal isolation component 112 relative to the processing and graphics electronics 114. The first surface 120 may contact a wall 124 between the thermal isolation component 112 and the processing and graphics electronics 114. The wall 124 may be, for example, part of a chassis 134.

The first surface 120 may have a number of pins 130, some of which contact a surface of the wall 124. The first surface 120 contacts the surface of the wall 124 only via the pins 130. Thus, only a portion of the area of the first surface 120 contacts the wall 124 which is between the thermal isolation component 112 and the processing and graphics electronics 114. For example, the portion of an area of the first surface 120 contacting the processing and graphics electronics 114 may be less than 10% of a total area of the first surface 120.

With respect to thermal isolation achieved through geometry, there may also be a small contact area between the thermal isolation component 112 and the LED heat sink 116. For example, FIG. 1 illustrates the thermal isolation component 112 having the first surface 120 facing the processing and graphics electronics 114 and the second surface 122 opposing the first surface 120 and facing the LED heat sink 116. The second surface 122 contacts the LED heat sink 116.

The LED heat sink 116 may have a number of pins 140 some of which contact the second surface 122 of the thermal isolation component 112. The LED heat sink 116 contacts the second surface 122 of the thermal isolation component 112 mostly via the pins 140. Thus, only a portion of the area of the second surface 122 contacts the LED heat sink 116. For example, the portion of an area of the second surface 122 contacting the LED heat sink 116 is less than 10% of a total area of the second surface 122. Most of the pins 140 may be of a length that they do not contact the second surface 122, but act to radiate heat from the LED heat sink 116. By limiting the number of pins 140 which contact the second surface 122, the heat conducted between the LED heat sink 116 and the thermal isolation component 112 is reduced.

Referring to FIG. 1, the LED display package 100 may include a back cover 144 in addition to the chassis 134. Together the back cover 144 and the chassis 134 enclose the processing and graphics electronics 114. The processing and graphics electronics 114 may be supported by the chassis 134, and may be in contact with the chassis 134.

The LED display package 100 may include a front bezel 150. The front bezel 150 may be in contact with the LED display assembly 110. Preferably the front bezel 150 is comprised of a good thermal conductor, and is in good thermal contact with the LED display assembly 110.

Figure 4A:
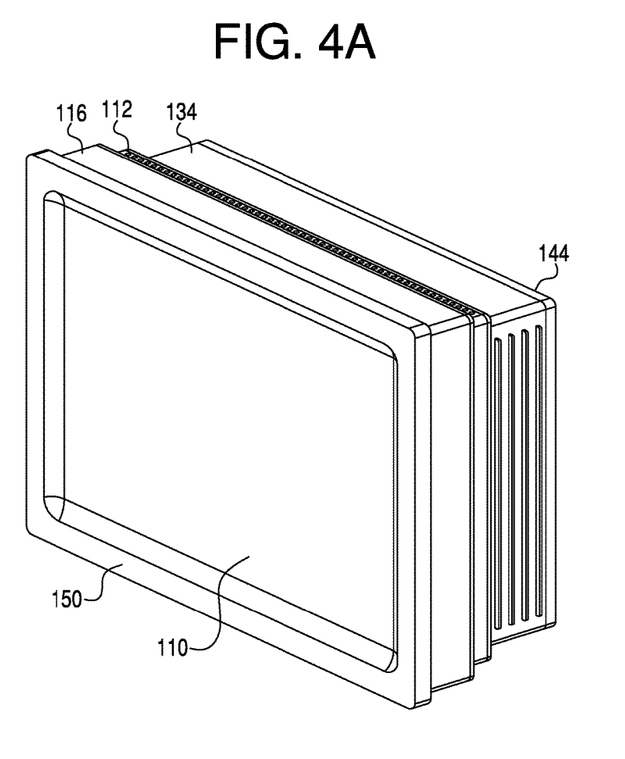
FIG. 4A is a perspective front view of the LED display package of the embodiment of FIG. 1 according to inventive concepts disclosed herein.
Figure 4B:
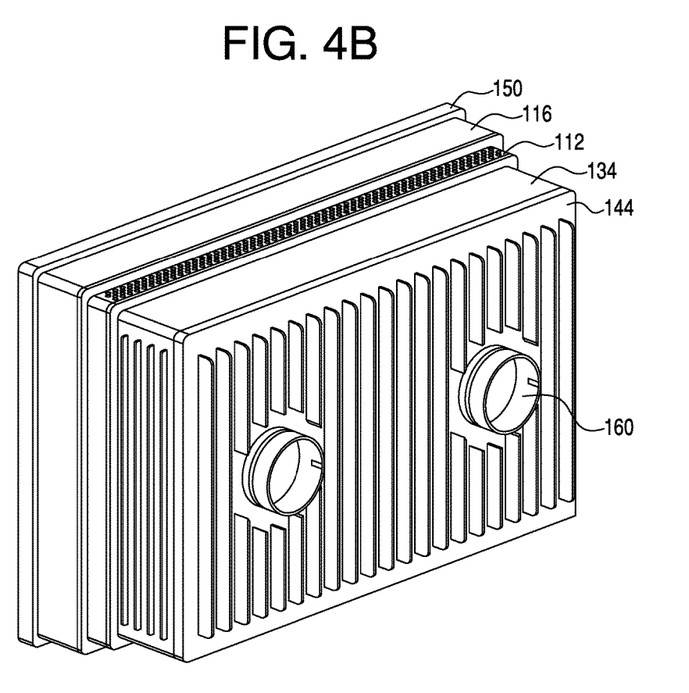
FIG. 4B is a perspective back view of the LED display package of FIG. 4A according to inventive concepts disclosed herein.
Figure 5A:
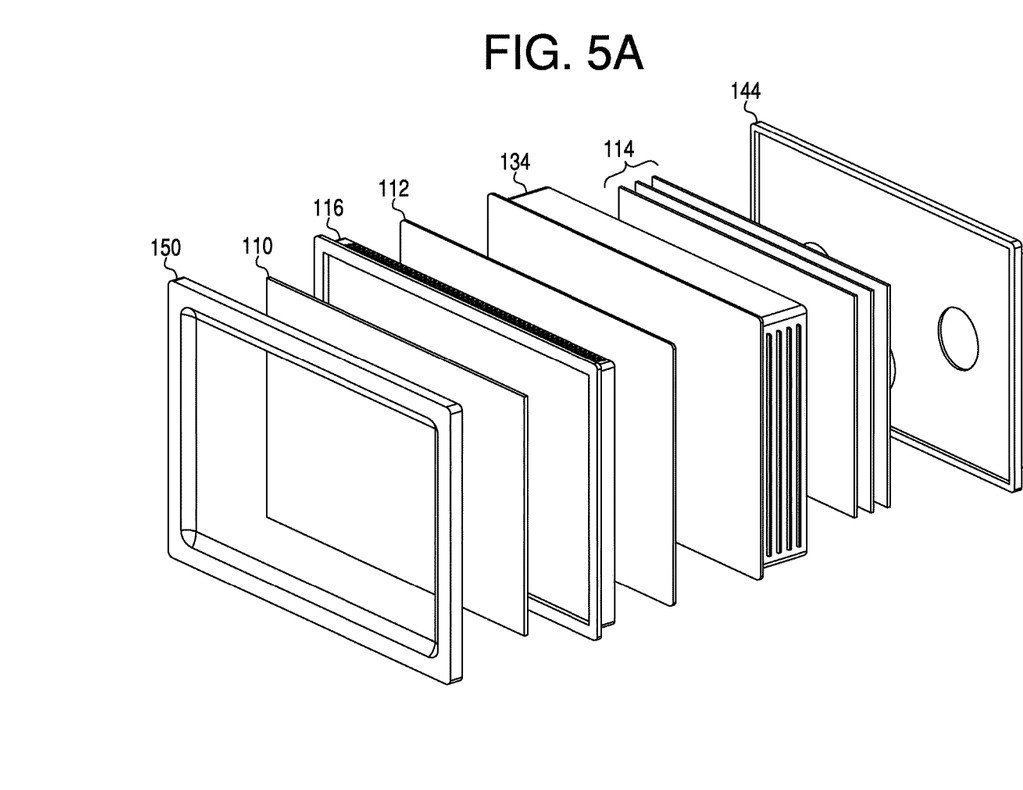
FIG. 5A is an exploded front view of the LED display package of FIG. 4A according to inventive concepts disclosed herein.
Figure 5B:
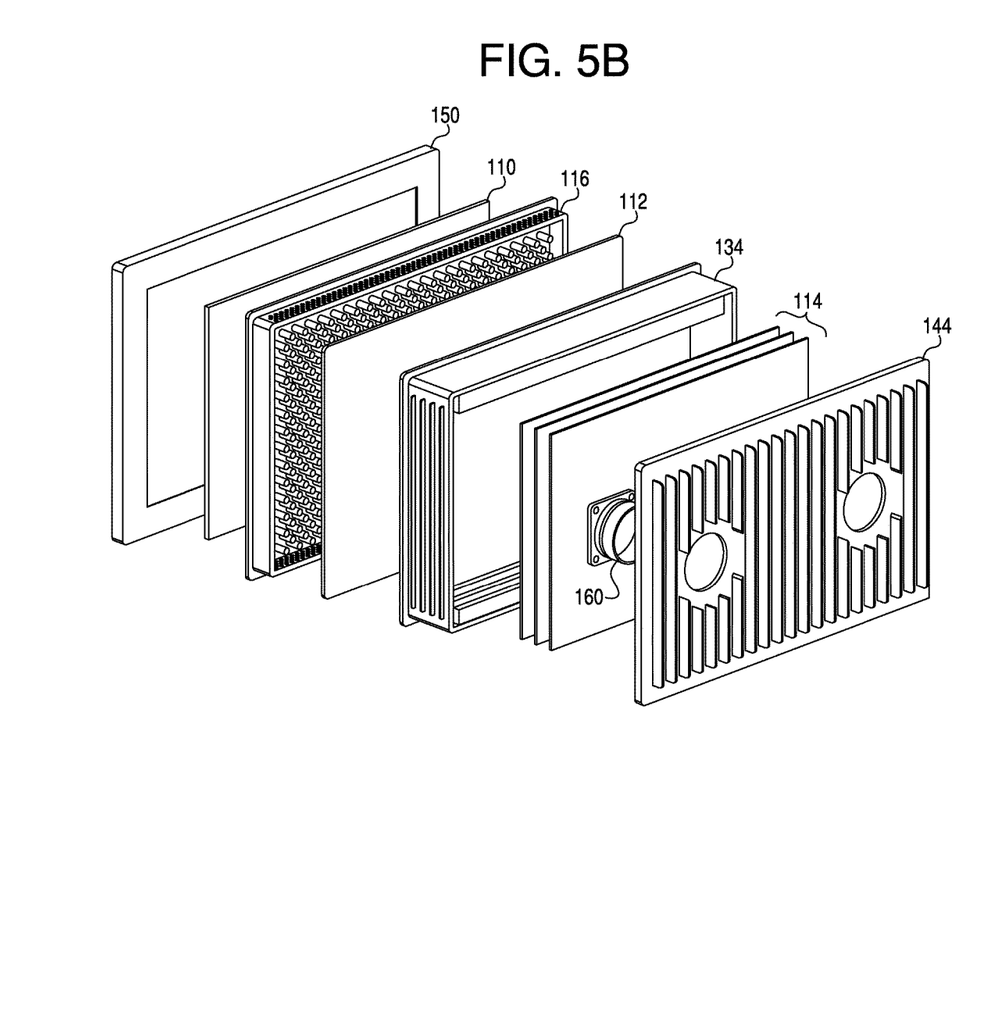
FIG. 5B is an exploded back view of the LED display package of FIG. 4A according to inventive concepts disclosed herein.
Figure 6:
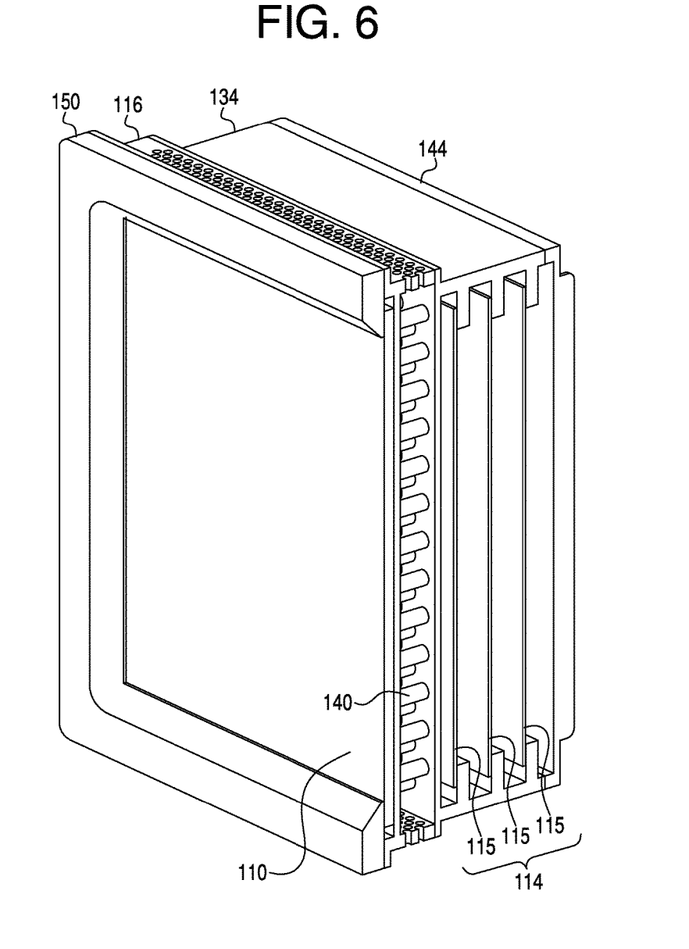
FIG. 6 is a perspective cross sectional view of the LED display package of FIG. 4A according to inventive concepts disclosed herein.
Figure 7:
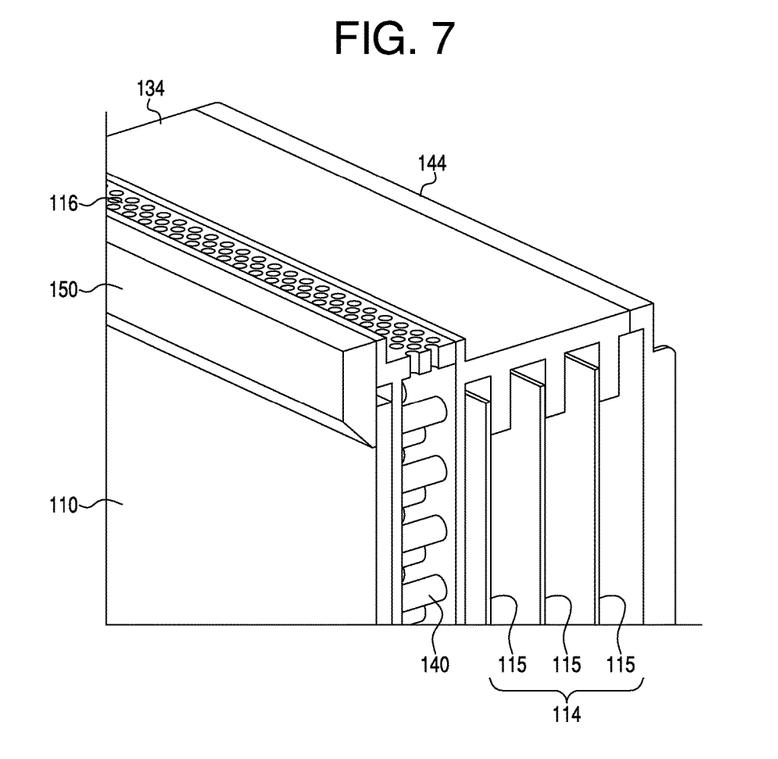
FIG. 7 is a magnified perspective cross sectional view of the LED display package of FIG. 6 according to inventive concepts disclosed herein.

FIG. 4A is a perspective front view of the LED display package of the embodiment of FIG. 1 according to inventive concepts disclosed herein. FIG. 4B is a perspective back view of the LED display package of FIG. 4A according to inventive concepts disclosed herein. FIG. 5A is an exploded front view of the LED display package of FIG. 4A according to inventive concepts disclosed herein, FIG. 5B is an exploded back view of the LED display package of FIG. 4A according to inventive concepts disclosed herein. FIG. 6 is a perspective cross sectional view of the LED display package of FIG. 4A according to inventive concepts disclosed herein. FIG. 7 is a magnified perspective cross sectional view of the LED display package of FIG. 6 according to inventive concepts disclosed herein. Like reference numerals in FIGS. 4A-7 represent and refer to the same elements as that in FIG. 1.

Referring to FIGS. 4A-7, the LED display package 100 includes an LED display assembly 110, a thermal isolation component 112, processing and graphics electronics 114, and an LED assembly heat sink 116 in a similar fashion to FIG. 1.

The processing and graphics electronics 114 may be implemented, for example, as circuit boards 115. FIGS. 4A-7 illustrate the processing and graphics electronics 114 to include three circuit boards 115. In general, the processing and graphics electronics 114 may include one or more circuit boards 115. The processing and graphics electronics 114 are configured to provide power and content to be applied to the LED display assembly 110. The processing and graphics electronics 114 in operation may generate heat, which may be greater than the heat generated by the LED display assembly 110.

The LED heat sink 116 is disposed between the processing and graphics electronics 114 and the LED display assembly 110. The LED heat sink 116 may comprise a metal, such as aluminum, copper, or alternative natural or engineered materials, for example. The thermal isolation component 112 is arranged between the LED heat sink 116 and the processing and graphics electronics 114 to thermally isolate the processing and graphics electronics 114 from the LED heat sink 116.

The LED display package 100 may further include a chassis 134 and a back cover 144. Together the back cover 144 and the chassis 134 enclose the processing and graphics electronics 114. The processing and graphics electronics 114 may be supported by the chassis 134, and may be in contact with the chassis 134.

The LED display package 100 may include a front bezel 150. The front bezel 150 may be in contact with the LED display assembly 110. Preferably the front bezel 150 is comprised of a good thermal conductor, and is in good thermal contact with the LED display assembly 110.

Referring to FIGS. 4B and 5B, the LED display package 100 may further include one or more electrical connection sockets 160, to allow electrical connection to the LED display package 100.

Figure 8:
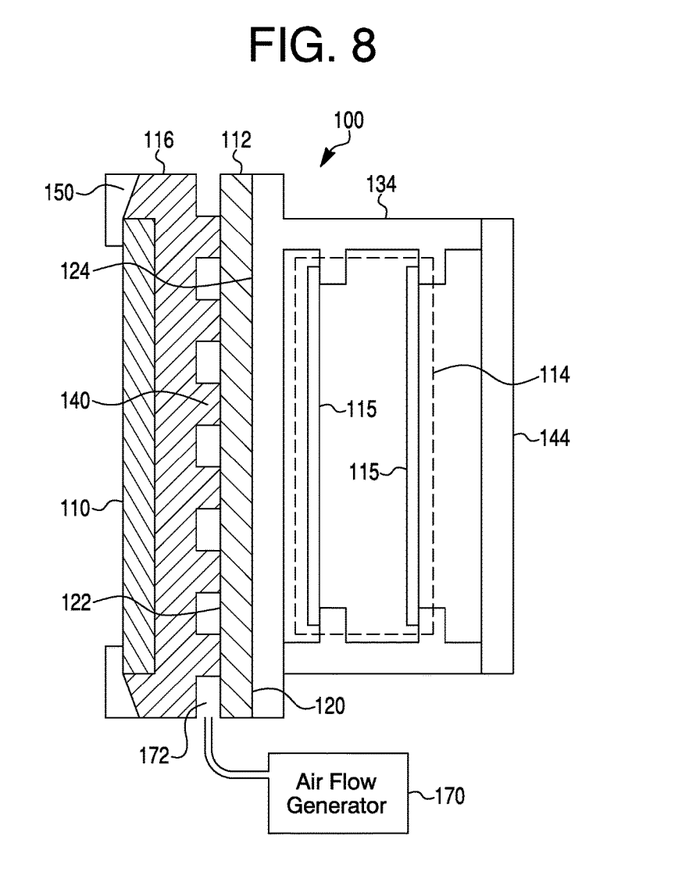
FIG. 8 is a schematic of an LED display package having an air flow generator of an embodiment according to the inventive concepts disclosed herein.

FIG. 8 is a schematic of an LED display package having an air flow generator of an embodiment according to the inventive concepts disclosed herein. The LED display package of FIG. 8 is similar to that of FIG. 1. Like reference numerals in FIG. 8 represent and refer to the same elements as that in FIG. 1.

Referring to FIG. 8, the LED display package 100 includes an LED display assembly 110, a thermal isolation component 112, processing and graphics electronics 114, and an LED assembly heat sink 116 in a similar fashion to FIG. 1. Further, the LED display package of FIG. 8 includes an air flow generator 170.

The air flow generator 170 is arranged to generate a flow of air past the LED display heatsink 116. In this regard the air flow generator 170 may provide a flow of air into gap regions 172 between the LED display heatsink 116 and the thermal isolator component 112. Thus, the air flow generator 170 may provide for convective cooling of the LED display heatsink 116.

Figure 9:
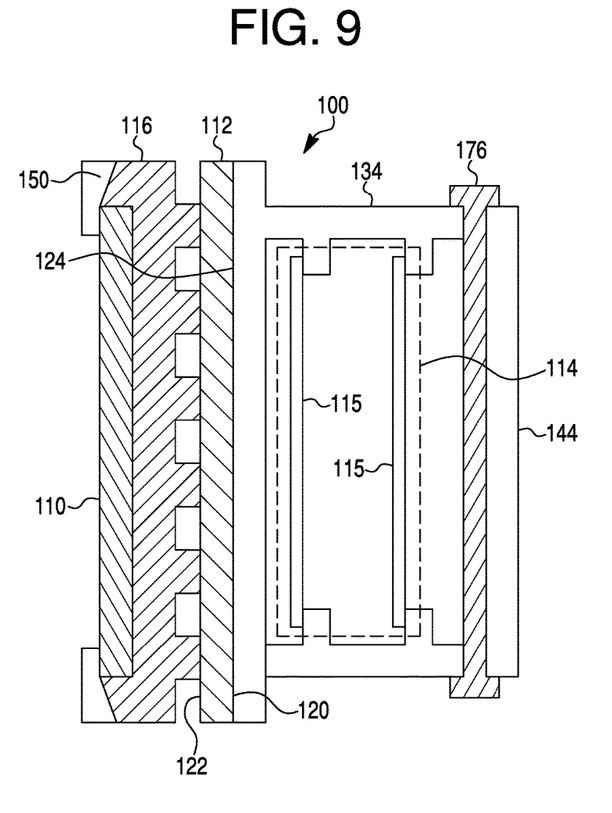
FIG. 9 is a schematic of an LED display package having a processing and graphics heat sink of an embodiment according to the inventive concepts disclosed herein.

FIG. 9 is a schematic of an LED display package having a processing and graphics heat sink of an embodiment according to the inventive concepts disclosed herein. Like reference numerals in FIG. 9 represent and refer to the same elements as that in FIG. 1.

Referring to FIG. 9, the LED display package 100 includes an LED display assembly 110, a thermal isolation component 112, processing and graphics electronics 114, and an LED assembly heat sink 116 in a similar fashion to FIG. 1. Further, the LED display package of FIG. 9 includes a processing and graphics electronics heat sink 176.

The processing and graphics electronics heat sink 176 is separate from the LED heatsink 116. The processing and graphics electronics heat sink 176 further is arranged to thermally contact the processing and graphics electronics 114. For example, the processing and graphics electronics heat sink 176 thermally contacts the processing and graphics electronics 114 via the chassis 134. Further, the processing and graphics electronics heat sink 176 radiates away the heat received from the processing and graphics electronics 114. The chassis 134 or back cover 144 may also include fins such that the chassis 134 or back cover 144 function as a heat sink for the processing and graphics electronics 114.

The embodiments of FIGS. 8 and 9 may be combined. That is the LED display package of contemplated embodiments according to the inventive concepts disclosed herein may include both a processing and graphics heat sink as well as an air flow generator.

The embodiments of the inventive concepts disclosed herein have been described in detail with particular reference to preferred embodiments thereof, but it will be understood by those skilled in the art that variations and modifications can be effected within the spirit and scope of the inventive concepts.

Embodiments of the inventive concepts disclosed herein have been described with reference to drawings. The drawings illustrate certain details of specific embodiments that implement systems and methods of the present disclosure. However, describing the embodiments with drawings should not be construed as imposing any limitations that may be present in the drawings.

The foregoing description of embodiments has been presented for the purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments with various modification as are suited to the particular use contemplated. Other substitutions, modifications, changes and omissions may be made in the design, operating conditions and arrangement of the embodiments without departing from the scope of the presently disclosed subject matter.

What is claimed is:

1. A light emitting diode (LED) display package, comprising:
   a LED display assembly comprising a plurality of LEDs;
   processing and graphics electronics configured to drive the LED display assembly;
   a LED heatsink thermally contacting the LED display assembly, and disposed between the LED display assembly and the processing and graphics electronics; and
   a thermal isolation component between the LED heatsink and the processing and graphics electronics arranged to thermally isolate the processing and graphics electronics from the LED heatsink, wherein the thermal isolation component comprises a thermal insulator having a first surface facing the processing and graphics electronics, and having a second surface opposing the first surface and facing the LED heat sink, wherein only a portion of an area of the second surface contacts the LED heatsink.

2. The LED display package according to claim 1, further comprising a wall disposed between the thermal insulator and the processing and graphics electronics, wherein the first surface contacts a surface of the wall.

3. The LED display package according to claim 2, further comprising a chassis partially enclosing the processing and graphics electronics, wherein the chassis includes the wall.

4. The LED display package according to claim 1, wherein only a portion of an area of the first surface contacts the wall.

5. The LED display package according to claim 1, wherein the LED display assembly comprises one of an array of organic light emitting diodes (OLEDs) or an array of micro LEDs.

6. The LED display package according to claim 1, further comprising a front bezel thermally contacting the LED display assembly.

7. The LED display package according to claim 1, further comprising:
   an air flow generator arranged to generate a flow of air past the LED heatsink.

8. The LED display package according to claim 1, further comprising:
   a processing and graphics electronics heat sink, separate from the LED heatsink, thermally contacting the processing and graphics electronics.

9. The LED display package according to claim 8, wherein the processing and graphics electronics comprises one or more circuit boards.

10. The LED display package according to claim 1, wherein the processing and graphics electronics comprises one or more circuit boards.

11. A light emitting diode (LED) display package, comprising:
    a LED display assembly comprising a plurality of LEDs;
    processing and graphics electronics configured to drive the LED display assembly;
    a LED heatsink thermally contacting the LED display assembly, and disposed between the LED display assembly and the processing and graphics electronics;
    a thermal insulating material between the LED heatsink and the processing and graphics electronics arranged to thermally isolate the processing and graphics electronics from the LED heatsink; and
    a processing and graphics electronics heat sink, separate from the LED heatsink, thermally contacting the processing and graphics electronics, wherein the thermal insulating material has a first surface facing the processing and graphics electronics, and has a second surface opposing the first surface and facing the LED heat sink, wherein only a portion of an area of the second surface contacts the LED heatsink.

12. The LED display package according to claim 11, wherein the processing and graphics electronics comprises one or more circuit boards.

13. The LED display package according to claim 11, further comprising a wall disposed between the thermal insulating material and the processing and graphics electronics, wherein the first surface contacts a surface of the wall.

14. The LED display package according to claim 13, further comprising a chassis partially enclosing the processing and graphics electronics, wherein the chassis includes the wall.

15. The LED display package according to claim 11, wherein the LED display assembly comprises one of an array of organic light emitting diodes (OLEDs) or an array of micro LEDs.

16. A light emitting diode (LED) display package, comprising:
    a LED display assembly comprising a plurality of LEDs;
    processing and graphics electronics configured to drive the LED display assembly;
    a LED heatsink thermally contacting the LED display assembly, and disposed between the LED display assembly and the processing and graphics electronics; and a thermal isolation component between the LED heatsink and the processing and graphics electronics arranged to thermally isolate the processing and graphics electronics from the LED heatsink, wherein the thermal isolation component comprises a thermal insulator having a first surface facing the processing and graphics electronics, and having a second surface opposing the first surface and facing the LED heat sink, wherein the LED heatsink comprises a plurality of heatsink pins contacting the second surface, and the LED heatsink contacts the second surface only via the heat sink pins.

* * * * *